(12) United States Patent
Rettig et al.

(10) Patent No.: US 7,217,941 B2
(45) Date of Patent: May 15, 2007

(54) SYSTEMS AND METHODS FOR DEFLECTING PLASMA-GENERATED IONS TO PREVENT THE IONS FROM REACHING AN INTERNAL COMPONENT OF AN EUV LIGHT SOURCE

(75) Inventors: Curtis L. Rettig, Vista, CA (US); Jerzy R. Hoffman, Escondido, CA (US); Ernesto L. Vargas, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 155 days.

(21) Appl. No.: 11/148,021

(22) Filed: Jun. 8, 2005

(65) Prior Publication Data
US 2005/0279946 A1    Dec. 22, 2005

Related U.S. Application Data

(63) Continuation-in-part of application No. 10/409,254, filed on Apr. 8, 2003, now Pat. No. 6,972,421.

(51) Int. Cl.
    *H01J 35/20* (2006.01)
(52) U.S. Cl. .............................. 250/504 R; 250/505.1; 134/1.1
(58) Field of Classification Search ............ 250/504 R, 250/505.1, 493.1; 134/1.1; 378/119
See application file for complete search history.

(56) References Cited

U.S. PATENT DOCUMENTS

| | | | |
|---|---|---|---|
| 2,740,963 A | 4/1956 | Donovan et al. | 342/34 |
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |

(Continued)

FOREIGN PATENT DOCUMENTS

JP    02-105478    4/1990

(Continued)

OTHER PUBLICATIONS

Apruzese, J.P., "X-Ray Laser Research Using Z Pinches," Am. Inst. Of Phys. 399-403, (1994).

(Continued)

*Primary Examiner*—Kiet T. Nguyen
(74) *Attorney, Agent, or Firm*—Matthew K. Hillman (57) ABSTRACT

A system is disclosed for protecting an internal EUV light source component from ions generated at a plasma formation site. In one aspect, the system may comprise a plurality of foil plates and an arrangement for generating a magnetic field to deflect ions into one of the foil plate surfaces. In another aspect, an electrostatic grid may be positioned for interaction with ions to reduce ion energy, and a magnetic field may be used to deflect the reduced energy ions onto paths wherein the ions do not strike the internal component. In yet another aspect, a grid may be connected to a circuit tuned to a resonant frequency to reduce ion energy. For example, the resonant frequency may be substantially equal to an inverse of a time difference between the time when electrons reach the grid and a subsequent time when ions reach the grid.

20 Claims, 4 Drawing Sheets

U.S. PATENT DOCUMENTS

| | | | | |
|---|---|---|---|---|
| 3,960,473 A | 6/1976 | Harris | | 425/467 |
| 3,961,197 A | 6/1976 | Dawson | | 250/493 |
| 3,969,628 A | 7/1976 | Roberts et al. | | 250/402 |
| 4,009,391 A | 2/1977 | Janes et al. | | 250/281 |
| 4,042,848 A | 8/1977 | Lee | | 313/231.6 |
| 4,088,966 A | 5/1978 | Samis | | 313/231.5 |
| 4,143,275 A | 3/1979 | Mallozzi et al. | | 250/503 |
| 4,162,160 A | 7/1979 | Witter | | 75/246 |
| 4,203,393 A | 5/1980 | Giardini | | 123/30 |
| 4,223,279 A | 9/1980 | Bradford, Jr. et al. | | 331/94.5 |
| 4,329,664 A | 5/1982 | Javan | | 359/276 |
| 4,364,342 A | 12/1982 | Asik | | 123/143 |
| 4,369,758 A | 1/1983 | Endo | | 123/620 |
| 4,455,658 A | 6/1984 | Sutte et al. | | 372/38 |
| 4,504,964 A | 3/1985 | Cartz et al. | | 378/119 |
| 4,507,588 A | 3/1985 | Asmussen et al. | | 315/39 |
| 4,534,035 A | 8/1985 | Long | | 372/85 |
| 4,536,884 A | 8/1985 | Weiss et al. | | 378/119 |
| 4,538,291 A | 8/1985 | Iwamatsu | | 378/119 |
| 4,550,408 A | 10/1985 | Karning et al. | | 372/58 |
| 4,561,406 A | 12/1985 | Ward | | 123/536 |
| 4,596,030 A | 6/1986 | Herziger et al. | | 378/119 |
| 4,618,971 A | 10/1986 | Weiss et al. | | 378/34 |
| 4,626,193 A | 12/1986 | Gann | | 431/71 |
| 4,633,492 A | 12/1986 | Weiss et al. | | 378/119 |
| 4,635,282 A | 1/1987 | Okada et al. | | 378/34 |
| 4,751,723 A | 6/1988 | Gupta et al. | | 378/119 |
| 4,752,946 A | 6/1988 | Gupta et al. | | 378/119 |
| 4,774,914 A | 10/1988 | Ward | | 123/162 |
| 4,837,794 A | 6/1989 | Riordan et al. | | 378/119 |
| 4,891,820 A | 1/1990 | Rando et al. | | 372/93 |
| 4,928,020 A | 5/1990 | Birx et al. | | 307/106 |
| 4,959,840 A | 9/1990 | Akins et al. | | 372/57 |
| 5,005,180 A | 4/1991 | Edelman et al. | | 372/57 |
| 5,022,033 A | 6/1991 | Hackell | | 372/25 |
| 5,023,884 A | 6/1991 | Akins et al. | | 372/57 |
| 5,023,897 A | 6/1991 | Neff et al. | | 378/122 |
| 5,025,445 A | 6/1991 | Anderson et al. | | 372/20 |
| 5,025,446 A | 6/1991 | Kuizenga | | 372/21 |
| 5,027,076 A | 6/1991 | Horsley et al. | | 324/674 |
| 5,070,513 A | 12/1991 | Letardi | | 372/83 |
| 5,091,778 A | 2/1992 | Keeler | | 348/31 |
| 5,102,776 A | 4/1992 | Hammer et al. | | 430/311 |
| 5,126,638 A | 6/1992 | Dethlefsen | | 315/326 |
| 5,142,166 A | 8/1992 | Birx | | 307/419 |
| 5,142,543 A | 8/1992 | Wakabayashi et al. | | 372/32 |
| 5,157,684 A | 10/1992 | Benda et al. | | 372/95 |
| 5,175,755 A | 12/1992 | Kumakhov | | 378/34 |
| 5,181,135 A | 1/1993 | Keeler | | 398/104 |
| 5,189,678 A | 2/1993 | Ball et al. | | 372/28 |
| 5,313,481 A | 5/1994 | Cook et al. | | 372/37 |
| 5,315,611 A | 5/1994 | Ball et al. | | 372/56 |
| 5,319,695 A | 6/1994 | Itoh et al. | | 378/84 |
| 5,359,620 A | 10/1994 | Akins | | 372/58 |
| 5,411,224 A | 5/1995 | Dearman et al. | | 244/53 |
| 5,425,922 A | 6/1995 | Kawaguchi | | 422/186 |
| 5,448,580 A | 9/1995 | Birx et al. | | 372/38 |
| 5,450,436 A | 9/1995 | Mizoguchi et al. | | 372/59 |
| 5,463,650 A | 10/1995 | Ito et al. | | 372/57 |
| 5,471,965 A | 12/1995 | Kapich | | 123/565 |
| 5,504,795 A | 4/1996 | McGeoch | | 378/119 |
| 5,563,555 A | 10/1996 | Nalos et al. | | 331/81 |
| 5,729,562 A | 3/1998 | Birx et al. | | 372/38 |
| 5,763,930 A | 6/1998 | Partlo | | 250/504 |
| 5,852,621 A | 12/1998 | Sandstrom | | 372/25 |
| 5,856,991 A | 1/1999 | Ershov | | 372/57 |
| 5,863,017 A | 1/1999 | Larson et al. | | 248/176.1 |
| 5,866,871 A | 2/1999 | Birx | | 219/121 |
| 5,933,271 A | 8/1999 | Waarts et al. | | 359/341.31 |
| 5,936,988 A | 8/1999 | Partlo et al. | | 372/38 |
| 5,953,360 A | 9/1999 | Vitruk et al. | | 372/87 |
| 5,963,616 A | 10/1999 | Silfvast et al. | | 378/122 |
| 5,978,394 A | 11/1999 | Newman et al. | | 372/32 |
| 5,991,324 A | 11/1999 | Knowles et al. | | 372/57 |
| 6,005,879 A | 12/1999 | Sandstrom et al. | | 372/25 |
| 6,016,323 A | 1/2000 | Kafka et al. | | 372/38 |
| 6,016,325 A | 1/2000 | Ness et al. | | 372/38 |
| 6,018,537 A | 1/2000 | Hofmann et al. | | 372/25 |
| 6,028,880 A | 2/2000 | Carlesi et al. | | 372/58 |
| 6,031,241 A | 2/2000 | Silfvast et al. | | 250/504 |
| 6,039,850 A | 3/2000 | Schulz | | 204/192.15 |
| 6,051,841 A | 4/2000 | Partlo | | 250/504 |
| 6,064,072 A | 5/2000 | Partlo et al. | | 250/504 |
| 6,067,306 A | 5/2000 | Sandstrom et al. | | 372/38.01 |
| 6,067,311 A | 5/2000 | Morton et al. | | 372/57 |
| 6,094,448 A | 7/2000 | Fomenkov et al. | | 372/102 |
| 6,104,735 A | 8/2000 | Webb | | 372/37 |
| 6,128,323 A | 10/2000 | Myers et al. | | 372/38.1 |
| 6,151,346 A | 11/2000 | Partlo et al. | | 372/38 |
| 6,151,349 A | 11/2000 | Gong et al. | | 372/58 |
| 6,164,116 A | 12/2000 | Rice et al. | | 73/1.72 |
| 6,172,324 B1 | 1/2001 | Birx | | 219/121.57 |
| 6,181,719 B1 | 1/2001 | Sukhman et al. | | 372/38.1 |
| 6,192,067 B1 | 2/2001 | Toda et al. | | 372/99 |
| 6,195,272 B1 | 2/2001 | Pascente | | 363/21 |
| 6,208,674 B1 | 3/2001 | Webb et al. | | 372/57 |
| 6,208,675 B1 | 3/2001 | Webb | | 372/58 |
| 6,219,368 B1 | 4/2001 | Govorkov | | 372/59 |
| 6,240,117 B1 | 5/2001 | Gong et al. | | 372/58 |
| 6,281,471 B1 | 8/2001 | Smart | | 219/121.62 |
| 6,285,743 B1 | 9/2001 | Kondo et al. | | 378/119 |
| 6,307,913 B1 | 10/2001 | Foster et al. | | 378/34 |
| 6,359,922 B1 | 3/2002 | Partlo et al. | | 372/58 |
| 6,370,174 B1 | 4/2002 | Onkels et al. | | 372/38.04 |
| 6,377,651 B1 | 4/2002 | Richardson et al. | | 378/34 |
| 6,381,257 B1 | 4/2002 | Ershov et al. | | 372/57 |
| 6,392,743 B1 | 5/2002 | Zambon et al. | | 355/69 |
| 6,396,900 B1 | 5/2002 | Barbee, Jr. et al. | | 378/84 |
| 6,404,784 B2 | 6/2002 | Komine | | 372/9 |
| 6,414,979 B2 | 7/2002 | Ujazdowski et al. | | 372/87 |
| 6,442,181 B1 | 8/2002 | Oliver et al. | | 372/25 |
| 6,452,199 B1 | 9/2002 | Partlo et al. | | 250/504 |
| 6,466,602 B1 | 10/2002 | Fleurov et al. | | 372/87 |
| 6,477,193 B2 | 11/2002 | Oliver et al. | | 372/58 |
| 6,493,323 B1 | 12/2002 | Dobrowolski et al. | | 378/119 |
| 6,493,374 B1 | 12/2002 | Fomenkov et al. | | 372/102 |
| 6,529,531 B1 | 3/2003 | Everage et al. | | 372/20 |
| 6,532,247 B2 | 3/2003 | Spangler et al. | | 372/61 |
| 6,535,531 B1 | 3/2003 | Smith et al. | | 372/25 |
| 6,538,737 B2 | 3/2003 | Sandstrom et al. | | 356/334 |
| RE38,054 E | 4/2003 | Hofmann et al. | | 372/25 |
| 6,541,786 B1 | 4/2003 | Partlo et al. | | 250/504 |
| 6,549,551 B2 | 4/2003 | Ness et al. | | 372/38.07 |
| 6,553,049 B1 | 4/2003 | Besaucele et al. | | 372/57 |
| 6,566,667 B1 | 5/2003 | Partlo et al. | | 250/504 |
| 6,566,668 B2 | 5/2003 | Rauch et al. | | 250/504 |
| 6,567,450 B2 | 5/2003 | Myers et al. | | 372/55 |
| 6,567,499 B2 | 5/2003 | McGeoch | | 378/119 |
| 6,576,912 B2 | 6/2003 | Visser et al. | | 250/492.2 |
| 6,584,132 B2 | 6/2003 | Morton | | 372/57 |
| 6,586,757 B2 | 7/2003 | Melnychuk et al. | | 250/504 |
| 6,621,846 B1 | 9/2003 | Sandstrom et al. | | 372/57 |
| 6,625,191 B2 | 9/2003 | Knowles et al. | | 372/55 |
| 6,635,844 B2 | 10/2003 | Yu | | 219/121.68 |
| 6,671,294 B2 | 12/2003 | Kroyan et al. | | 372/20 |
| 6,721,340 B1 | 4/2004 | Fomenkov et al. | | 372/25 |
| 6,757,316 B2 | 6/2004 | Newman et al. | | 372/57 |
| 6,765,945 B2 | 7/2004 | Sandstrom et al. | | 372/57 |
| 6,782,031 B1 | 8/2004 | Hofmann et al. | | 372/90 |
| 6,787,788 B2 | 9/2004 | Shell et al. | | 250/504 |
| 6,795,474 B2 | 9/2004 | Partlo et al. | | 372/57 |
| 6,972,421 B2* | 12/2005 | Melnychuk et al. | | 250/504 R |
| 2001/0055364 A1 | 12/2001 | Kandaka et al. | | 378/119 |
| 2002/0006149 A1 | 1/2002 | Spangler et al. | | 372/61 |

| | | | |
|---|---|---|---|
| 2002/0009176 A1 | 1/2002 | Ameniya et al. ............. 378/34 |
| 2002/0012376 A1 | 1/2002 | Das et al. ..................... 372/58 |
| 2002/0014598 A1 | 2/2002 | Melnychuk et al. ........ 250/504 |
| 2002/0014599 A1 | 2/2002 | Rauch et al. ............... 250/504 |
| 2002/0021728 A1 | 2/2002 | Newman et al. ............. 372/55 |
| 2002/0048288 A1 | 4/2002 | Kroyan et al. ................ 372/20 |
| 2002/0100882 A1 | 8/2002 | Partlo et al. ................ 250/504 |
| 2002/0101589 A1 | 8/2002 | Sandstrom et al. ......... 356/334 |
| 2002/0105994 A1 | 8/2002 | Partlo et al. .................. 372/57 |
| 2002/0114370 A1 | 8/2002 | Onkels et al. ................ 372/55 |
| 2002/0141536 A1 | 10/2002 | Richardson ................ 378/119 |
| 2002/0154668 A1 | 10/2002 | Knowles et al. ............. 372/55 |
| 2002/0162973 A1 | 11/2002 | Cordingley et al. ..... 250/492.2 |
| 2002/0163313 A1 | 11/2002 | Ness et al. .............. 315/111.01 |
| 2002/0168049 A1 | 11/2002 | Schriever et al. ........... 378/119 |
| 2003/0006383 A1 | 1/2003 | Melynchuk et al. ........ 250/504 |
| 2003/0068012 A1 | 4/2003 | Ahmad et al. .............. 378/119 |
| 2003/0219056 A1 | 11/2003 | Yager et al. .................. 372/57 |
| 2004/0047385 A1 | 3/2004 | Knowles et al. ............. 372/55 |
| 2005/0174576 A1 | 8/2005 | Rao et al. ................... 356/454 |

FOREIGN PATENT DOCUMENTS

| | | |
|---|---|---|
| JP | 03-173189 | 7/1991 |
| JP | 06-053594 | 2/1994 |
| JP | 09-219555 | 8/1997 |
| JP | 2000-058944 | 2/2000 |

OTHER PUBLICATIONS

Bollanti et al., "Compact Three Electrodes Excimer Laser IANUS for a POPA Optical System," SPIE Proc. (2206) 144-153, (1994).
Bollanti et al., "Ianus, the three-electrode excimer laser," App. Phys. B (Lasers & Optics) 66(4):401-406, (1998).
Braun et al., "Multi-component EUV Multilayer Mirros," Proc. SPIE, 5037:2-13, (2003).
Choi et al., "A 1013 A/s High Energy Density Micro Discharge Radiation Source," B. Radiation Characteristics, p. 287-290.
Choi et al., "Fast pulsed hollow cathode capillary discharge device," Rev. of Sci. Instrum. 69(9):3118-3122 (1998).
Choi et al., Temporal development of hard and soft x-ray emission from a gas-puff Z pinch, Rev. Sci. Instrum. 57(8), pp. 2162-2164 (Aug. 1986).
Coutts et al., "High average power blue generation from a copper vapour laser pumped titanium sapphire laser", Journal of Modern Optics, vol. 45, No. 6, p. 1185-1197 (1998).
Feigl et al., "Heat Resistance of EUV Multilayer Mirrors for Long-time Applications," Microelectric Engineering, 57-58:3-8, (2001).
Fomenkov et al., "Characterization of a 13.5nm Source for EUV Lithography based on a Dense Plasma Focus and Lithium Emission," Sematech Intl. Workshop on EUV Lithography (Oct. 1999).
Giordano et al., "Magnetic pulse compressor for prepulse discharge in spiker-sustainer excitati technique for XeCl lasers," Rev. Sci. Instum. 65(8), pp. 2475-2481 (Aug. 1994).
Hansson et al., Xenon liquid jet laser-plasma source for EUV lithography,: Emergine Lithographic Technologies IV, Proc. of SPIE, vol. 3997-729:729-732 (2000).
Hercher, "Tunable single mode operation of gas lasers using intracavity tilted etalons," Applied Optics, vol. 8, No. 6, Jun. 1969, pp. 1103-1106.
Jahn, Physics of Electric Propulsion, McGraw-Hill Book Company, (Series in Missile and Space U.S.A.), Chap. 9, Unsteady Electromagnetic acceleration, p. 257 (1968).
Kato, Yasuo, Electrode Lifetimes in a Plasma Focus Soft X-Ray Source, J. Appl. Phys. (33) Pt. 1, No. 8:4742-4744 (1991).
Kato et al., "Plasma focus x-ray source for lithograpy," Am. Vac. Sci. Tech. B., 6(1): 195-198 (1988).
Lebert et al., "Soft x-ray emission of laser-produced plasmas using a low-debris cryogenic nitrogen target," J. app. Phys. 84(6): 3419-3421 (1998).
Lebert et al., "A gas discharge based radiation source for EUV-lithography," Intl. Conf. Micro and Nano-Engineering 98 (Sep. 2-24, 1998) Leuven, Belgium.
Lebert et al., Investigation of pinch plasmas with plasma parameters promising ASE, Inst. Phys. Conf. Ser No. 125: Section 9. pp. 411-415 (1992) Schiersee, Germany.
Lebert et al., "Comparison of laser produced and gas discharge based EUV sources for different applications," *International Conference Micro-and Nano-Engineering 98*, Sep. 22-24, 1998. Leuven, Belgium. 6 pages.
Lee, Ja H., "Production of dense plasmas in hypocyloidal pinch apparatus," The Phys. Of Fluids, 20(2):313-321 (1977).
Lewis, Ciaran L.S., "Status of collision-pumped x-ray lasers," Am Int. Phys. pp. 9-16 (1994).
Lowe, "Gas plasmas yield x rays for lithography," Electronics, pp. 40-41 (Jan. 27, 1982).
Malmqvist et al., "Liquid-jet target for laser-plasma soft x-ray generation," Am. Inst. Phys. 67(12):4150-4153 (1996).
Maruyama et al., Characteristics of high-power excimer laser master oscillator power amplifier system for dye laser pumping, Optics Communications, vol. 87, No. 3 p. 105-108 (1992).
Mather et al., "Stability of the dense plasma focus," Phys. of Fluids, 12(11):2343-2347 (1969).
Mather, "Formation of a high-density deuterium plasma focus," The Physics of Fluids, 8(2), 366-377 (Feb. 1965).
Matthews et al., "Plasma sources for x-ray lithography," SPIE, 333, Submicron Lithography, pp. 136-139 (1982).
Mayo et al., "A magnetized coaxial source facility for the generation of energetic plasma flows," Sci. Technolo. vol. 4:pp. 47-55 (1994).
Mayo et al., "Initial results on high enthalpy plasma generation in a magnetized coaxial source," Fusion Tech vol. 26:1221-1225 (1994).
Nilsen et al., "Analysis of resonantly photopumped Na-Ne x-ray-laser scheme," Am Phys. Soc. 44(7): 4591-4597 (1991).
Partlo et al., "EUV (13.2nm) light generation using a dense plasma focus device," SPIE Proc. on Emerging Lithographic Technologies III, vol. 3676, 846-858 (Mar. 1999).
Pearlman et al., "X-ray lithography using a pulsed plasma source," J. Vac. Sci. Technol., pp. 1190-1193 (Nov./Dec. 1981).
Porter et al., "Demonstration of population Inversion by resonant photopumping in a neon gas cell irradiated by a sodium Z pinch," Phys. Rev. Let., 68(6):796-799, (Feb. 1992).
Price, Robert H., "X-ray microscopy using grazing incidence reflection optics," Am. Inst. Phys., pp. 189-199, (1981).
Qi et al., Fluorescence in Mg IX emission at 48.430 Å from Mg pinch plasmas photopumped by Al XI line radiaton at 48.355 Å The Am. Phys. 47(3):2253-2263 (Mar. 1993).
Scheuer et al., "A Magnetically-Nozzled, Quais-Steady, Multimegawatt, Coaxial Plasma Thruster," IEEE: Transactions on Plasma Science, 22(6) (Dec. 1994).
Schriever, et al., "Laser-produced lithium plasma as a narrow-band extended ultraviolet radiation source for photoelectron spectroscopy," App. Optics, 37(7):1243-1248. (Mar. 1998).
Schriever et al., "Narrowband laser produced extreme ultraviolet sources adapted to silicon/molybdenum multiplayer optics," J. of App. Phys. 83(9):4566-4571, (May 1998).
Shiloh et al. "Z pinch of a gas jet," Physical Review Lett., 40(8), pp. 515-518 (Feb. 20, 1978).
Silfvast et al., "High-power plasma discharge source at 13.5 nm and 11.4 nm for EUV lithography," SPIE, vol. 3676:272-275. (Mar. 1999).
Silfvast et al., "Lithium hydride capillary discharge creates x-ray plasma at 13.5 namometers," Laser Focus World, p. 13. (Mar. 1997).
Stallings et al., "Imploding argon plasma experiments," Appl. Phys. Lett., 35(7), pp. 524-526 (Oct. 1, 1979).
Tada et al., "1-pm spectrally narrowed compact ArF excimer laser for microlithography", Laser and Electro-Optics, CLEO '96, CThG4, p. 374 (1996).
Wilhein et al., "A slit grating spectrograph for quantitative soft x-ray spectroscopy," Am. Inst. Of Phys. Rev. of Sci. Instrum., 70(3):1694-1699, (Mar. 1999).
Wu et al., "The vacuum spark and spherical pinch x-ray/EUV point sources," SPIE, Conf. On Emerging Tech. III, Santa Clara, CA, vol. 3676:410-420. (Mar. 1999).
Yusheng et al., "Recent progress of "Heaven-One" high power KrF excimer laser system", Laser and Electro-Optics, CLEO '99, vol. 2, p. 302-303 (1999).
Zombeck, M.V., "Astrophysical observations with high resolution x-ray telescope," Am. Inst. Of Phys., pp. 200-209, (1981).

* cited by examiner

SYSTEMS AND METHODS FOR DEFLECTING PLASMA-GENERATED IONS TO PREVENT THE IONS FROM REACHING AN INTERNAL COMPONENT OF AN EUV LIGHT SOURCE

CROSS-REFERENCE TO RELATED APPLICATIONS

This application is a continuation-in-part of U.S. Ser. No. 10/409,254 filed Apr. 8, 2003, now U.S. Pat. No. 6,972,421 the disclosure of which is hereby incorporated by reference herein. This application is related to U.S. Ser. No. 10/798,740 filed Mar. 10, 2004, the disclosure of which is hereby incorporated by reference herein.

FIELD OF THE INVENTION

The present invention relates to extreme ultraviolet ("EUV") light sources providing EUV light from a plasma created from a source material and collected and directed to a focus for utilization outside of the EUV light source chamber, e.g., for semiconductor integrated circuit manufacturing photolithography e.g., at wavelengths of around 20 nm and below.

BACKGROUND OF THE INVENTION

Extreme ultraviolet ("EUV") light, e.g., electromagnetic radiation having wavelengths of around 20 nm or less, and including light at a wavelength of about 13.5 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed electric discharge produced plasma ("DPP"), the plasma may be produced by an electrical discharge between a pair of electrodes. In another method, the required plasma can be produced by irradiating a target material, such as a droplet, stream or cluster of material having the required line-emitting element, with a laser beam. This later process is referred to as laser produced plasma ("LPP").

For each of these processes, the plasma is typically produced in a sealed vessel, e.g., vacuum chamber, and monitored using various types of metrology equipment. In addition to generating EUV radiation, these plasma processes also typically generate undesirable by-products in the plasma chamber which can include heat, high energy ions and scattered debris from the plasma formation, e.g., atoms and/or clumps of source material that is not fully ionized in the plasma formation process.

These plasma formation by-products can potentially damage or reduce the operational efficiency of the various plasma chamber internal components including, but not limited to, collector mirrors including multi-layer mirrors (MLM's) capable of EUV reflection at normal incidence and grazing angle incident mirrors, the surfaces of metrology detectors, windows used to image the plasma formation process, and in the case of LPP, the laser input window. The heat, high energy ions and/or source material debris may be damaging to the optical elements in a number of ways, including heating them, coating them with materials which reduce light transmission, penetrating into them and, e.g., damaging structural integrity and/or optical properties, e.g., the ability of a mirror to reflect light at such short wavelengths, corroding or eroding them, diffusing into them and/or sputtering surface material. In addition, some optical elements, e.g., the laser input window, form a part of the vacuum chamber and are thus placed under a stress when a vacuum is present in the plasma chamber. For these elements, deposits and heat can combine to fracture (i.e., crack) the element resulting in a loss of vacuum and requiring a costly repair.

Accessing contaminated or damaged optical elements in the plasma chamber for the purpose of cleaning or replacing the elements can be expensive, labor intensive and time-consuming. In particular, these systems typically require a rather complicated and time consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

With the above in mind, applicants disclose systems and methods for deflecting plasma-generated ions to prevent the ions from reaching an internal component of an EUV light source.

SUMMARY OF THE INVENTION

A system for protecting an internal component of an EUV light source from ions generated at a plasma formation site and initially directed toward the internal component is disclosed. The system may comprise a plurality of foil plates interposed between the internal component and the plasma formation site, with each foil plate having a surface substantially aligned along a respective line extending from the plasma formation site to the internal component. The system may further comprise a means for generating a magnetic field to deflect an ion into one of the foil plate surfaces. The internal component may be an elliptical collector mirror which defines an axis with the plasma formation site lying on the axis, and the magnetic field may be a substantially uniform magnetic field having a magnetic field line oriented substantially normal to the axis at the plasma formation site. A second magnetic field may be established, normal to the first magnetic field and positioned such that the second field has a magnetic field line oriented substantially normal to the axis at a non-zero distance from the plasma formation site.

In another aspect of an embodiment of the present invention, a system for protecting an internal EUV light source component from ions may include an electrostatic grid positioned for interaction with the ions to reduce ion energy; and a magnetic source generating a magnetic field to deflect the reduced energy ions onto paths wherein the ions do not strike the internal component. By way of example, in an aspect of an embodiment of the present invention, an elliptically shaped collector mirror can be protected from a 2 KeV ion generated during plasma formation using an electrostatic grid to slow the ions together with permanent magnets to deflect the energy reduced ions away from the collector mirror.

In yet another aspect of an embodiment of the present invention, a system for protecting an internal EUV light source component from ions generated at a plasma formation site which emits an electron pulse followed by an ion pulse may include a grid positioned at a distance, d, from the plasma formation site. The grid may be oriented for interaction with the ions and connected to a circuit tuned to a resonant frequency to reduce ion energy. For example, the resonant frequency may be substantially equal to an inverse of a time delay between 1) the time when the electron pulse reaches the grid, and 2) the time when the ion pulse reaches the grid.

DETAILED DESCRIPTION OF PREFERRED EMBODIMENTS

Figure 1:
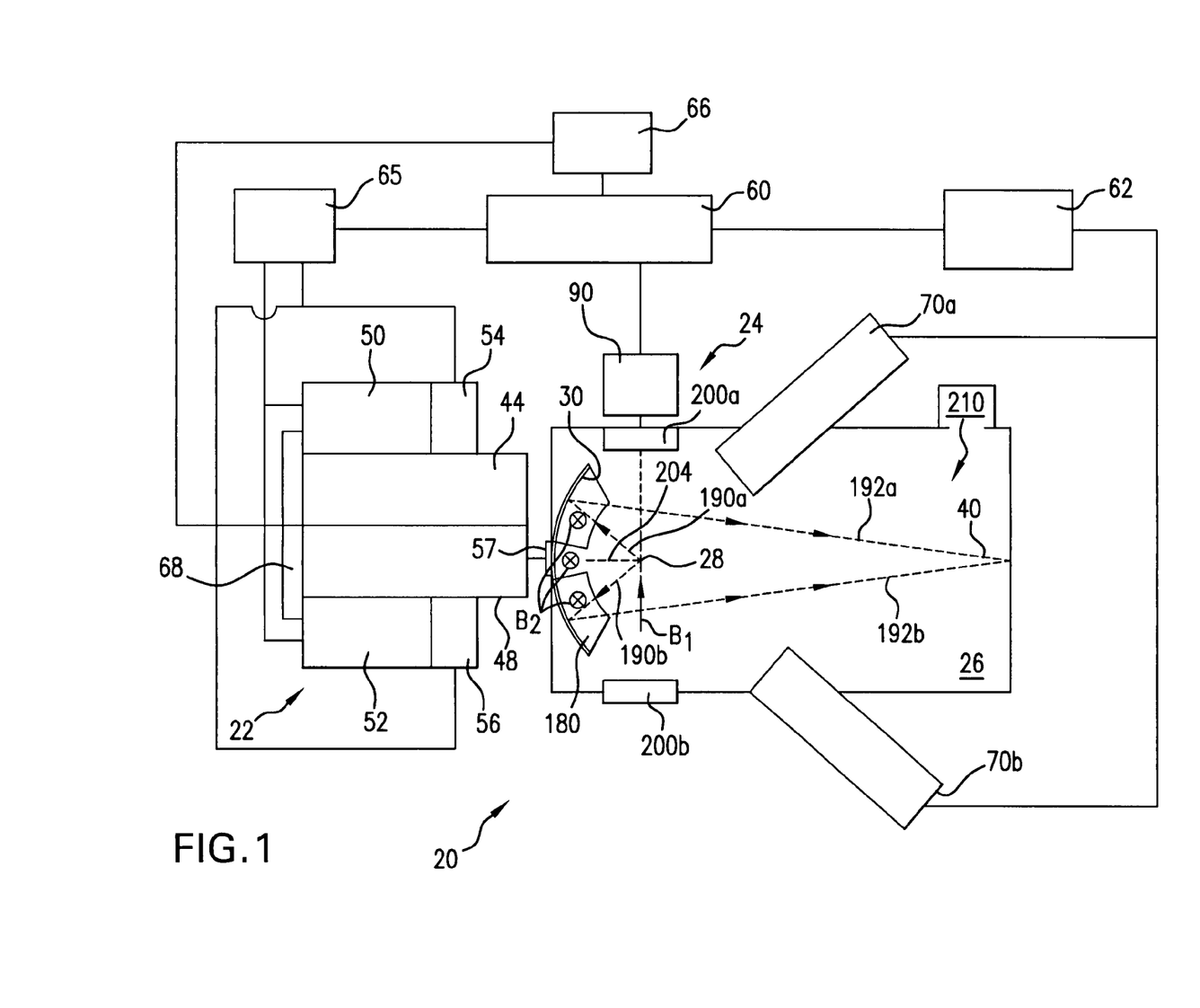
FIG. 1 shows a schematic view of an overall broad conception for a laser-produced plasma EUV light source according to an aspect of the present invention.

With initial reference to FIG. 1, there is shown a schematic view of an exemplary production EUV light source, e.g., a laser produced plasma EUV light source 20, according to an aspect of the present invention. Although aspects of the present invention are illustrated with reference to a laser produced plasma (LPP), it is to be appreciated that the present invention is equally applicable to other types of light sources which produce a plasma including an electric discharge produced plasma ("DPP"), a representative construction of which is disclosed in co-owned U.S. Pat. No. 6,815,700, which is hereby incorporated by reference.

Continuing with FIG. 1, an LPP light source 20 may contain a pulsed laser system 22, e.g., a gas discharge excimer or molecular fluorine laser operating at high power and high pulse repetition rate and may be a MOPA configured laser system, e.g., as shown in U.S. Pat. Nos. 6,625,191, 6,549,551, and 6,567,450. The light source 20 may also include a target delivery system 24, e.g., delivering targets in the form of liquid droplets, a liquid stream, solid particles or clusters, solid particles contained within liquid droplets or solid particles contained within a liquid stream. The targets may be delivered by the target delivery system 24, e.g., into the interior of a chamber 26 to a plasma formation site 28, otherwise known as an ignition site or the sight of the "fire ball".

Laser pulses may be delivered from the pulsed laser system 22 along a laser optical axis through a laser input window 57 and into the chamber 26 to the irradiation site, suitably focused, to create an ignition or fire ball that forms a plasma, having certain characteristics which depend on the source material of the target. These characteristics may include the wavelength of the EUV light produced and the type and amount of debris released from the plasma during and/or after ignition.

The light source may also include a collector 30, e.g., a reflector, e.g., in the form of a truncated ellipse, with an aperture to allow the laser light to pass through and reach the ignition site 28. The collector 30 may be, e.g., an elliptical mirror that has a first focus at the ignition site 28 and a second focus at a so-called intermediate point 40 (also called the intermediate focus 40) where the EUV light is output from the light source and input to, e.g., an integrated circuit lithography tool (not shown).

The pulsed system 22 may include a dual chamber, e.g., a master oscillator-power amplifier ("MOPA"), gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 65, along with, e.g., a laser beam positioning system 66.

The system 20 may also include a target position detection system which may include one or more droplet imagers 70a,b that provide an output indicative of the position of a target droplet, e.g., relative to the ignition site and provide this output to the target position detection feedback system, which can, e.g., compute a target position and trajectory, from which a target error can be computed, if not on a droplet by droplet basis then on average. The target error may then be provided as an input to the system controller 60, which can, e.g., provide a laser position, direction and timing correction signal, e.g., to the laser beam positioning system 66 that the laser beam positioning system can use, e.g., to control the laser timing circuit and/or to control the laser position and direction changer 68, e.g., to change the focus point of the laser beam to a different ignition point 28.

The target delivery control system 90, in response to a signal from the system controller 60 may, e.g., modify the release point of the target droplets as released by a target delivery mechanism to correct for errors in the target droplets arriving at the desired ignition site 28. An EUV light source detector (not shown) may also provide feedback to the system controller 60 that can be, e.g., indicative of the errors in such things as the timing and focus of the laser pulses to properly intercept the target droplets in the right place and time for effective and efficient EUV light production.

As shown schematically in FIG. 1 and described in more detail below, an aspect of an embodiment of the present invention may include a system for protecting an EUV light source internal component, which for the embodiment shown in FIG. 1 may be a collector mirror 30, from ions generated at a plasma formation site and initially directed toward the component, e.g. collector mirror 30. As shown, the system may include a shield 180, e.g. a foil trap, and one or more magnetic sources, which for the embodiment shown in FIG. 1 may be a first pair of spaced-apart energized coils 200a,b for establishing a magnetic field $B_1$, and a second pair of spaced-apart energized coils 202a,b (shown in FIG. 2A) for establishing a magnetic field $B_2$ (illustrated in FIG. 1). Although the system is shown in a configuration to protect a surface of an EUV light source collector mirror 30, it is to be appreciated that the system as described herein can be used to protect other optical elements in the chamber 26 including, but not limited to, the laser input window 57, imaging windows for imagers 70a,b and/or an input surface of a metrology monitor (not shown).

Figure 2:
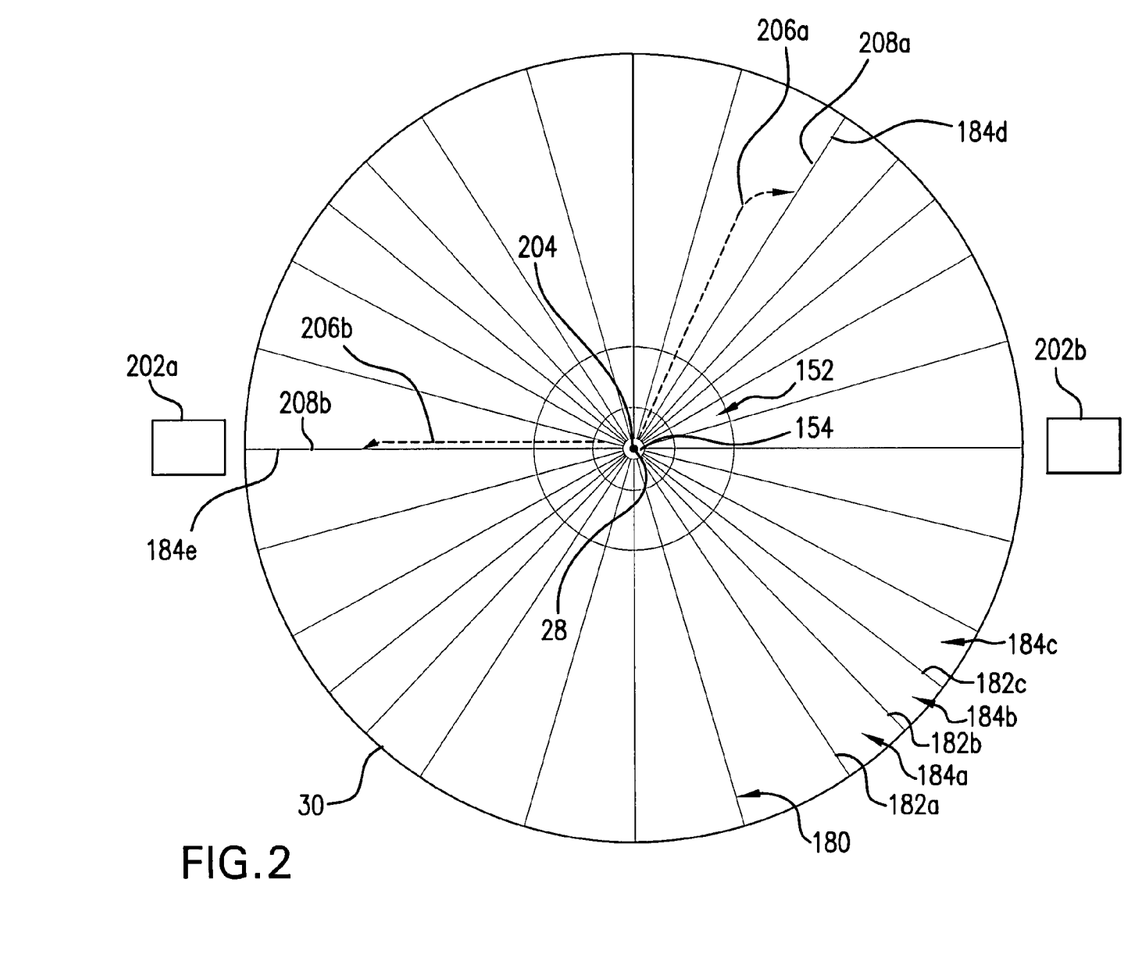
FIG. 2 shows a schematic side view illustrating an embodiment of an EUV debris shield for an elliptical collector mirror according to an aspect of the present invention as seen from an irradiation ignition point looking toward the collector mirror.

FIG. 2 shows in more detail a foil trap shield 180 which may be used in the system shown in FIG. 1. Specifically, FIG. 2 shows a schematic view of a collector 30 and shield 180 as would be seen if looking into the elliptical collector mirror 30 from a vantage point at the intermediate focus 40 (See FIG. 1). As shown in FIG. 2 the elliptical collection mirror 30 is circular in cross section looking at the mirror and as shown in FIG. 1 may define an axis 204 which includes the focus point 28 of the elliptical mirror 30.

The elliptical mirror may also have an aperture 152, e.g., shown to be circular in FIG. 2, to allow entry of the LPP laser beam 154, e.g., focused through focusing optics, through the mirror 30 to the ignition point 28 desired to be at the focus of the elliptical mirror. The aperture 152 can also be, e.g., more tailored to the beam profile, e.g., generally rectangular, within the requirements, if any of modifying the beam optical path to make corrections of the focus of the laser beam 154 on an ignition site, depending upon the type of control system employed.

Also shown in FIGS. 1 and 2 is a foil trap debris shield 180 according to an aspect of an embodiment of the present invention. The debris shield 180 may be made up of a plurality of thin foil plates, of which exemplary plates 182a–c have been labeled, made, e.g., of thin foils of molybdenum. As best seen in FIG. 2, each foil plate 182a–c may extend substantially radially outward from the axis 204, and, as shown in FIG. 1, each foil plate of the debris shield 180 may be interposed between the ignition site 28 and the collector mirror 30. It can be further seen in FIG. 2 that a light transmitting channel (exemplary channels 184a–c have been labeled) may be established between each pair of adjacent foil plates 182a–c allowing EUV light to pass through the debris shield 180. Although the shield 180 shown in FIG. 2 includes twenty-eight foil plates, it is to be appreciated that more than twenty-eight and as few as one foil plate may be used. Additional foil plates may, in some cases, result in greater debris capture, however the addition of foil plates may also reduce the channel size, and thus, allow less EUV light to pass through the shield 180 (note: it is desirable to block as little of the EUV light emitted from the plasma as possible).

Cross-referencing FIG. 1 with FIG. 2, the functionality of the radially aligned channels 182a–c in the debris shield 180 can be seen. A radial channel is seen in FIG. 1 and is illustrative of the rotationally symmetric debris shield 180. FIG. 1 shows exemplary paths for two EUV light rays 190a,b emitted from the ignition site 28. As shown, each ray travels from the ignition site 28 and may pass through a channel 182 in the debris shield 180, which as shown in FIG. 1 may, if desired, extend all the way to the collection mirror 150 reflective surface. Upon striking the surface of the elliptical mirror 150, at any angle of incidence, the ray 190a may be reflected back within the same channel 180 as a reflected ray 192a and be directed to the intermediate focus 40.

FIG. 2 illustrates exemplary trajectories for two ions under the influence of the magnetic fields, $B_1$ and $B_2$. As shown, ion 206a leaves the plasma formation site 28 on a trajectory toward the collector mirror 30 and may be deflected by the magnetic field $B_1$ into the surface 208a of the foil plate 184d where the ion may be captured. On the other hand, due to the alignment of magnetic field $B_1$, the magnetic field $B_1$, alone, may be insufficient to deflect all ions into the debris shield 180. Instead, for some ion trajectories, such as ion 206b shown, the effect of the magnetic field $B_1$, may only be to further accelerate the ion into the collector mirror 30. However, as shown, the second magnetic field $B_2$, may be aligned to deflect the ion 206b into the surface 208b of the foil plate 184e where the ion may be captured. For the embodiment shown, the magnetic field, $B_1$, may be a substantially uniform magnetic field having a magnetic field line oriented substantially normal to the axis 204 at the plasma formation site 28. When used, the second magnetic field $B_2$, may be established, normal to the first magnetic field $B_1$, and positioned such that the second field $B_2$, has a magnetic field line oriented substantially normal to the axis 204 at a distance from the plasma formation site 28, as shown in FIG. 1. In some cases, the second magnetic field $B_2$, may be somewhat weaker than the first magnetic field $B_1$. Numerically, for a collector located approximately 20 cm from the plasma formation site 28, calculations suggest that a relatively small magnetic field of less than about 100 Gauss may provide sufficient lateral motion to deflect 2 KeV ions in a debris shield having channel widths of about 2 mm and an aspect ratio of about 50. Such a field can be established over relatively large volumes, for example, using cooled coils. This may be compared with a field strength of about 1 Tesla that may be required to sufficiently deflect all 2 KeV ions, without a debris shield, onto trajectories which do not intercept a collector mirror.

FIG. 1 also shows that the system may further comprise a gas source 210 to introduce gas molecules into the chamber 26, e.g. helium or argon, between the plasma formation site 28 and the collector mirror 30. In use, the gas molecules may collide with plasma debris particles (charged or neutral) that are generated at the plasma formation site and directed toward the collector mirror 30. These collisions may slow particles and/or deflect the particles into the foil plates 182 of the debris shield 180, protecting the surface of the collector mirror 30 from debris accumulation.

Figure 3:
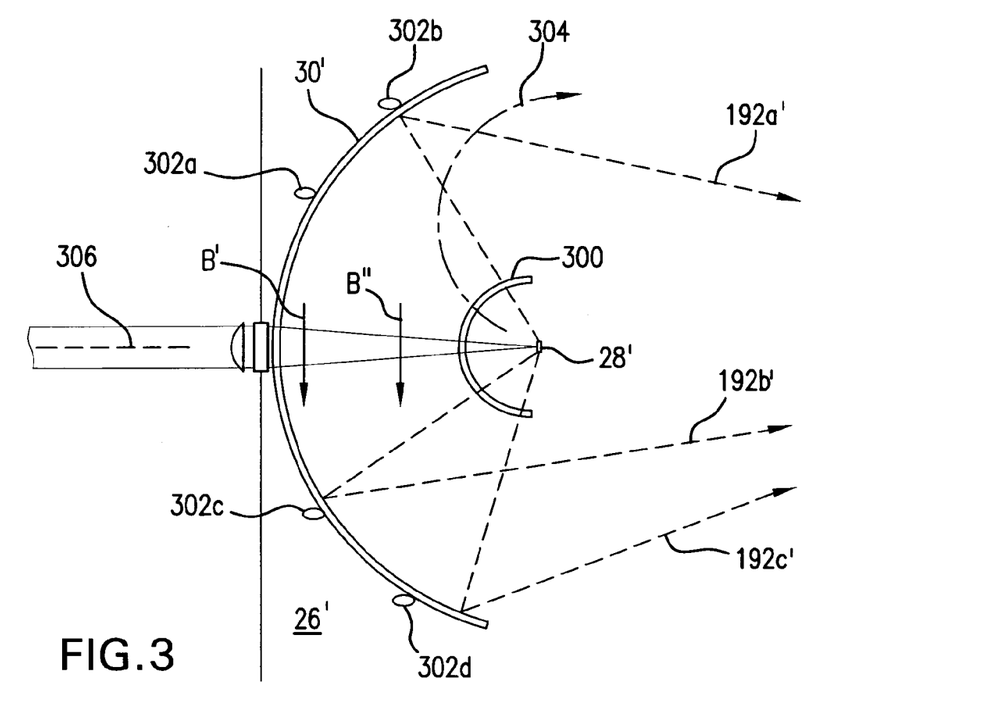
FIG. 3 is a schematic view illustrating another aspect of an embodiment of the present invention in which an electrostatic grid in combination with a magnetic field may be used to deflect ions away from an EUV light source internal component.

FIG. 3 is a schematic view illustrating another aspect of an embodiment of the present invention in which an electrostatic grid 300 in combination with one or more magnetic fields, B', B" may be used to deflect ions, e.g. ions generated during plasma formation, away from an EUV light source internal component, which for the embodiment shown in FIG. 3 is a collector mirror 30' for reflecting EUV light rays 192a'–c' to an intermediate focus. Although the system is shown in a configuration to protect a surface of an EUV light source collector mirror 30', it is to be appreciated that the system as described herein can be used to protect other optical elements in the chamber 26' including, but not limited to, the laser input window 57', imaging windows for imagers and/or an input surface of a metrology monitor (not shown).

Figure 4:
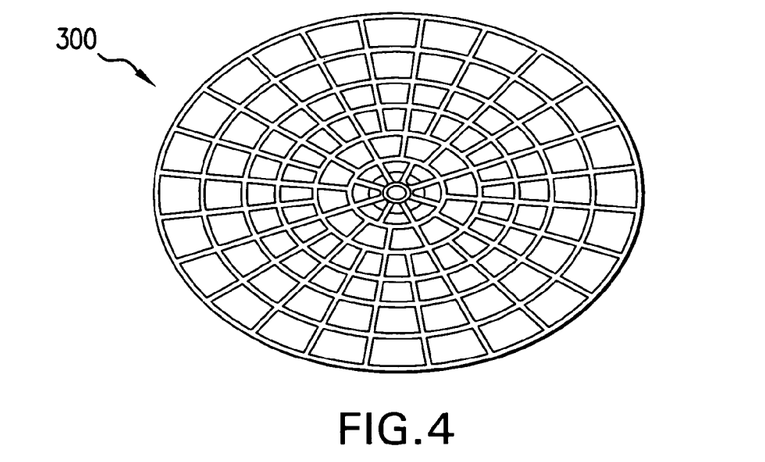
FIG. 4 is a perspective view of an electrostatic grid suitable for use in the embodiment shown in FIG. 3.

Structurally, as shown in FIG. 3, the charged grid 300 may be positioned between a plasma formation site 28' and collector mirror 30' and may function to reduce ion energy (reduce ion speed) as the ions pass through the grid 300 (see also FIG. 4). Also shown, the system may include one or more magnetic sources 302a–d to establish one or more magnetic fields B', B" between the grid 300 and collector mirror 30'. In some cases, the ions may be slowed sufficiently by the grid such that a moderate magnetic field may be capable of deflecting the slowed ions away from the collector mirror 30. Thus, for some implementations, the magnetic sources 302a–d may be energized coil(s), permanent magnet(s) or combinations thereof.

FIG. 3 illustrates an exemplary trajectory for an ion 304 which leaves the plasma formation site 28' on a path directed toward the collector mirror 30'. More specifically, the exemplary ion 304 is initially directed on a trajectory having a non-zero velocity component, v, that is orthogonal to both the magnetic field B' and the laser axis 306 (i.e. the ion is traveling out of the plane of the page). As shown, the ion 304 may pass through the grid 300 where it is slowed, and then enters a region where the ion interacts with one or more magnetic fields, B', B". Under the influence of the magnetic fields, B' and B", the ion 304 is deflected away from the collector mirror 30' in accordance with the well known equation:

$$F = q\mathbf{v} \times \mathbf{B}$$

where F is the deflection force, bolded terms represent vector quantities, and q is the ion charge.

Figure 5:
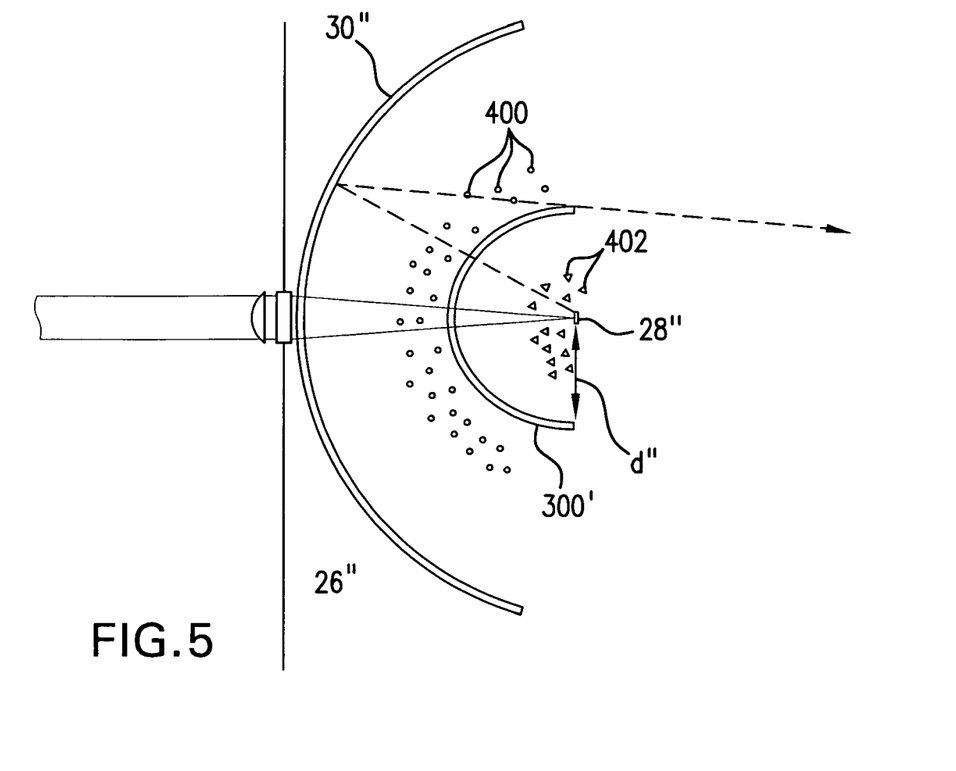
FIG. 5 is a schematic view illustrating another aspect of an embodiment of the present invention in which a grid connected to a resonant circuit may be used to slow ions.

FIG. 5 illustrates another aspect of an embodiment of the present invention in which a grid 300" may be positioned at a distance, "d", from a plasma formation site 28". Upon plasma formation, e.g. interaction between a laser pulse and a target, a pulse of electrons 400 may be emitted from the site 28" traveling at an average velocity $v_e$, followed by a pulse of ions 402' traveling at an average velocity $v_{ion}$, with $v_e > v_{ion}$. For a grid 300' at a distance, "d", from the site 28", the ions 402 reach the grid 300' after the electrons 400 and establish a time delay, t, between the electron pulse and the ion pulse at the grid 300'.

Figure 6:
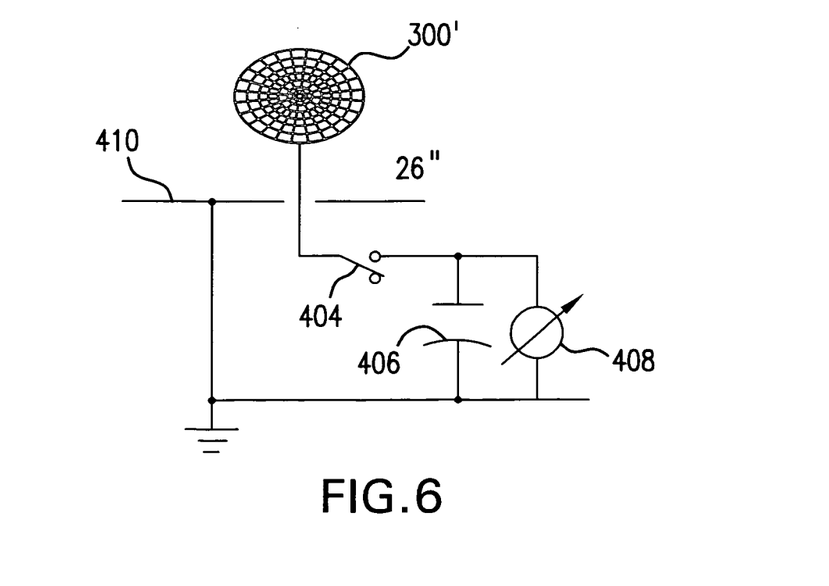
FIG. 6 is a schematic diagram of an electrical circuit suitable for use in the device shown in FIG. 5.

FIG. 6 shows that the grid 300' may be electrically connected to a circuit having a switch 404, capacitor 406 and power supply 408. The circuit can maintain a pre-selected voltage on the grid 300', and includes capacitor 406 that may be coupled through low inductance to the grid 300' and charged up to the desired grid potential. The capacitance of the capacitor 406 may be selected to tune the circuit to a resonant frequency that may be substantially equal to an inverse of the time delay, t, between the electron pulse and the ion pulse at the grid 300'. With this structure, the electric field established by the grid 300' goes through a single cycle at the transit time frequency and the grid 300' may interact with ions 402 to reduce ion energy. In particular, depending on the grid potential and ion energy, the grid 300" may slow, stop or turn-back the ions 402. In one implementation, currents driven in the circuit by the passing, bunched, electrons may be dissipated, and subsequently, the ions 404 may be slowed by the back EMF of the circuit current. Alternatively, the grid 300' can be driven by an external oscillator with opposite phase such that the energy in the ion pulse is damped out (see FIG. 6). In this latter case, the switch 404 may be opened during periods when ions are not present near the grid 300' to reduce shorting between the grid 300' and plasma chamber wall 410. A second, grounded grid (not shown) may be positioned near the grid 300' to reduce, and in some cases, eliminate shorting.

Experiments conducted with a grid 300' at an appropriate distance, d, showed Sn ions having an average initial energy of approximately 2.3 KeV were significantly slowed by the grid when the value of the capacitor was in the 0.1 uF range. This corresponds to a resonant frequency of approximately 1 Mhz. In the case where a laser produced plasma is established at the formation site by a pulsed laser source, the circuit may be synchronized with the pulsed laser source. Slowed ions may be deflected away from the internal component by a magnetic field that may be established between the grid and the internal component (See FIG. 3). In some cases, the slowed ions can be deflected into a foil trap debris shield (See FIGS. 1 and 2).

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art.

We claim:

1. A system for protecting an internal component of an EUV light source from ions generated at a plasma formation site and initially directed toward the internal component, said system comprising:
   at least one foil plate interposed between the internal component and the plasma formation site, said foil plate having a surface substantially aligned along a line extending from the plasma formation site to the internal component; and
   a magnetic source generating a magnetic field to deflect an ion into the foil plate surface.

2. A system as recited in claim 1 wherein said surface is substantially planar.

3. A system as recited in claim 1 wherein said magnetic field is a first magnetic field and said system further comprises a second magnetic source generating a second magnetic field to deflect an ion into the foil plate surface, said second magnetic field oriented substantially orthogonal to said first magnetic field.

4. A system as recited in claim 3 wherein said component defines an axis, said plasma formation site lies along said axis, and said first magnetic field is a substantially uniform magnetic field having a magnetic field line oriented substantially normal to said axis at said plasma formation site.

5. A system as recited in claim 4 wherein said second magnetic field is a substantially uniform magnetic field having a magnetic field line oriented substantially normal to said axis at a distance from said plasma formation site.

6. A system as recited in claim 1 wherein said at least one foil plate is a plurality of spaced apart foil plates, each said foil plate having a surface substantially aligned along a respective line extending from the plasma formation site to the internal component.

7. A system as recited in claim 1 wherein said internal component is a mirror.

8. A system as recited in claim 7 wherein said mirror is elliptically shaped.

9. A system as recited in claim 1 wherein said component defines an axis, said plasma formation site lies along said axis, and each said foil plate surface is substantially aligned radially relative to said axis.

10. A system as recited in claim 1 further comprising a gas source providing gas molecules between said plasma formation site and said internal component, said gas molecules for colliding with plasma debris particles to deflect said particles into said foil plate.

11. A system for protecting an internal component of an EUV light source from ions generated at a plasma formation site and initially directed toward the internal component, said system comprising:
    an electrostatic grid positioned for interaction with said ions to reduce ion energy; and
    a magnetic source generating a magnetic field to deflect the reduced energy ions onto paths wherein said ions do not strike the internal component.

12. A system as recited in claim 11 wherein said internal component is a mirror.

13. A system as recited in claim 12 wherein said mirror is elliptically shaped.

14. A system as recited in claim 11 wherein said magnetic source comprises at least one permanent magnet.

15. A system as recited in claim 14 wherein said electrostatic grid and a magnetic source cooperate to slow and deflect a 2 KeV ion from an initial path to a deflected path wherein the deflected path is inclined at an angle of at least 45 degrees from said initial path.

16. A system for protecting an internal component of an EUV light source from ions generated at a plasma formation site, said site emitting an electron pulse followed by an ion pulse, said system comprising:
 a grid positioned at a distance, d, from the plasma formation site, the grid oriented for interaction with said ions to reduce ion energy; and
 a circuit electrically connected to said grid and tuned to a resonant frequency, said resonant frequency being substantially equal to an inverse of a time delay between the electron pulse and the ion pulse at the grid.

17. A system as recited in claim 16 wherein a laser produced plasma is established at the formation site by a pulsed laser source and said circuit is synchronized with said pulsed laser source.

18. A system as recited in claim 16 further comprising a magnetic source generating a magnetic field between the grid and the internal component to deflect the reduced energy ions onto paths wherein said ions do not strike the internal component.

19. A system as recited in claim 16 wherein said ions are Sn having an average energy of approximately 2.3 KeV and said resonant frequency is approximately 1 Mhz.

20. A system as recited in claim 16 wherein said circuit comprises an oscillator to drive said circuit.

* * * * *